United States Patent
Weaver et al.

(10) Patent No.: US 10,427,303 B2
(45) Date of Patent: Oct. 1, 2019

(54) SUBSTRATE DEPOSITION SYSTEMS, ROBOT TRANSFER APPARATUS, AND METHODS FOR ELECTRONIC DEVICE MANUFACTURING

(71) Applicant: Applied Materials, Inc., Santa Clara, CA (US)

(72) Inventors: William T. Weaver, Austin, TX (US); Malcolm N. Daniel, Jr., Austin, TX (US); Robert B. Vopat, Austin, TX (US); Jason M. Schaller, Austin, TX (US); Jacob Newman, Palo Alto, CA (US); Dinesh Kanawade, San Jose, CA (US); Andrew J. Constant, Cupertino, CA (US); Stephen C. Hickerson, Hollister, CA (US); Jeffrey C. Hudgens, San Francisco, CA (US); Marvin L. Freeman, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 455 days.

(21) Appl. No.: 14/211,049

(22) Filed: Mar. 14, 2014

(65) Prior Publication Data
US 2014/0271055 A1    Sep. 18, 2014

Related U.S. Application Data

(60) Provisional application No. 61/879,076, filed on Sep. 17, 2013, provisional application No. 61/868,795, (Continued)

(51) Int. Cl.
*B25J 9/16* (2006.01)
*B25J 11/00* (2006.01)
(Continued)

(52) U.S. Cl.
CPC ............ *B25J 9/1682* (2013.01); *B25J 9/043* (2013.01); *B25J 11/0095* (2013.01);
(Continued)

(58) Field of Classification Search
CPC ...... B25J 9/043; B25J 9/1682; B25J 11/0095; H01L 21/67742
See application file for complete search history.

(56) References Cited

U.S. PATENT DOCUMENTS 5,789,878 A    8/1998    Kroeker et al.
5,879,127 A    3/1999    Grunes et al.
(Continued)

FOREIGN PATENT DOCUMENTS

CN    101101888 A    1/2008
CN    101678974 A    3/2010
(Continued)

OTHER PUBLICATIONS

Hudgens et al., U.S. Appl. No. 14/090,899 (17504), titled: Multi-Axis Robot Apparatus With Unequal Length Forearms, Electronic Device Manufacturing Systems, and Methods for Transporting Substrates in Electronic Device Manufacturing, filed Nov. 26, 2013.
(Continued)

*Primary Examiner* — James Keenan
(74) *Attorney, Agent, or Firm* — Lowenstein Sandler LLP

(57) ABSTRACT

Electronic device processing systems may include a mainframe housing having a transfer chamber, a first carousel assembly, a second carousel assembly, a first load lock, a second load lock, and a robot adapted to operate in the transfer chamber to exchange substrates between the first and second carousels and the first and second load locks. The robot may include first and second end effectors operable to extend and/or retract simultaneously or sequentially along substantially co-parallel lines of action. Methods and multi-
(Continued)

axis robots for transporting substrates are described, as are numerous other aspects.

10 Claims, 15 Drawing Sheets

Related U.S. Application Data filed on Aug. 22, 2013, provisional application No. 61/787,117, filed on Mar. 15, 2013.

(51) Int. Cl.
| | | |
|---|---|---|
| *H01L 21/67* | (2006.01) | |
| *H01L 21/677* | (2006.01) | |
| *B25J 9/04* | (2006.01) | |

(52) U.S. Cl.
CPC .... *H01L 21/6719* (2013.01); *H01L 21/67161* (2013.01); *H01L 21/67196* (2013.01); *H01L 21/67201* (2013.01); *H01L 21/67742* (2013.01); *Y10S 901/29* (2013.01); *Y10T 74/20305* (2015.01)

(56) References Cited

U.S. PATENT DOCUMENTS

| | | | |
|---|---|---|---|
| 6,267,549 B1 | 7/2001 | Brown et al. | |
| 6,379,095 B1 | 4/2002 | Elliott et al. | |
| 6,582,175 B2 | 6/2003 | Cox et al. | |
| 6,669,434 B2* | 12/2003 | Namba | B25J 9/042 |
| | | | 414/744.1 |
| 6,722,834 B1 | 4/2004 | Tepman | |
| 7,891,935 B2* | 2/2011 | Kremerman | B25J 9/042 |
| | | | 414/744.5 |
| 9,190,306 B2* | 11/2015 | Blank | B25J 9/042 |
| 9,245,783 B2* | 1/2016 | Blank | B25J 9/043 |
| 9,281,222 B2* | 3/2016 | Weaver | H01L 21/67196 |
| 9,325,228 B2* | 4/2016 | Hudgens | H02K 5/128 |
| 9,623,555 B2* | 4/2017 | Krupyshev | B25J 9/043 |
| 10,137,576 B2* | 11/2018 | Gilchrist | H01L 21/67742 |
| 10,157,763 B2* | 12/2018 | Mitchell | H01L 21/67745 |
| 2002/0098072 A1 | 7/2002 | Sundar | |
| 2004/0005211 A1 | 1/2004 | Lowrance et al. | |
| 2004/0168633 A1 | 9/2004 | Nozawa et al. | |
| 2005/0079043 A1* | 4/2005 | Ogawa | B25J 9/1065 |
| | | | 414/744.2 |
| 2006/0099063 A1* | 5/2006 | Pietrantonio | B25J 9/042 |
| | | | 414/744.5 |
| 2006/0245905 A1 | 11/2006 | Hudgens | |
| 2007/0116549 A1 | 5/2007 | Rice et al. | |
| 2008/0063504 A1 | 3/2008 | Kroetz et al. | |
| 2008/0298945 A1 | 12/2008 | Cox et al. | |
| 2010/0178135 A1 | 7/2010 | Laceky et al. | |
| 2010/0178146 A1 | 7/2010 | Kremerman et al. | |
| 2010/0178147 A1 | 7/2010 | Kremerman et al. | |
| 2012/0085638 A1 | 4/2012 | Mullapudi et al. | |
| 2012/0232690 A1 | 9/2012 | Gilchrist et al. | |
| 2012/0308341 A1 | 12/2012 | Ishizawa et al. | |
| 2013/0039726 A1 | 2/2013 | Brodine et al. | |
| 2013/0115028 A1 | 5/2013 | Kremerman et al. | |
| 2013/0121798 A1* | 5/2013 | Hosek | H01L 21/677 |
| | | | 414/744.5 |
| 2013/0149076 A1 | 6/2013 | Cox et al. | |
| 2014/0010625 A1 | 1/2014 | Hudgens et al. | |
| 2014/0348618 A1 | 11/2014 | Blank | |
| 2015/0013910 A1* | 1/2015 | Krupyshev | B25J 9/042 |
| | | | 156/345.32 |
| 2016/0027676 A1* | 1/2016 | Blank | B25J 9/042 |
| | | | 414/744.5 |

FOREIGN PATENT DOCUMENTS

| | | |
|---|---|---|
| CN | 102612739 A | 7/2012 |
| JP | 2004-080053 | 3/2004 |
| JP | 2004-282002 | 10/2004 |
| JP | 2005-032942 | 2/2005 |
| JP | 2011-77399 | 4/2011 |
| JP | 2011-511460 | 4/2011 |
| JP | 2011-222825 | 11/2011 |
| JP | 2013-42112 | 2/2013 |
| KR | 10-0850436 B1 | 8/2008 |
| TW | 201032282 | 9/2010 |

OTHER PUBLICATIONS

Kremerman, U.S. Appl. No. 14/090,929 (17504US/02), titled: Motor Modules, Multi-Axis Motor Drive Assemblies, Multi-Axis Robot Apparatus, and Electronic Device Manufacturing Systems and Methods, filed Nov. 26, 2013.

International Preliminary Report on Patentability and Written Opinion of International Patent Application No. PCT/US2014/027567 dated Sep. 24, 2015.

International Search Report and Written Opinion of International Patent Application No. PCT/US2014/027567 dated Jul. 2, 2014.

Chinese Search Report of Chinese Application No. 201480025132.8 dated Mar. 20, 2017.

Taiwan Search Report of Taiwan Application No. 103109720 dated Aug. 23, 2017.

Chinese Search Report of Chinese Application No. 201480025132.8 dated Jun. 4, 2018.

Japanese Office Action of Japanese Application No. 2016-502480 dated Nov. 6, 2018.

* cited by examiner

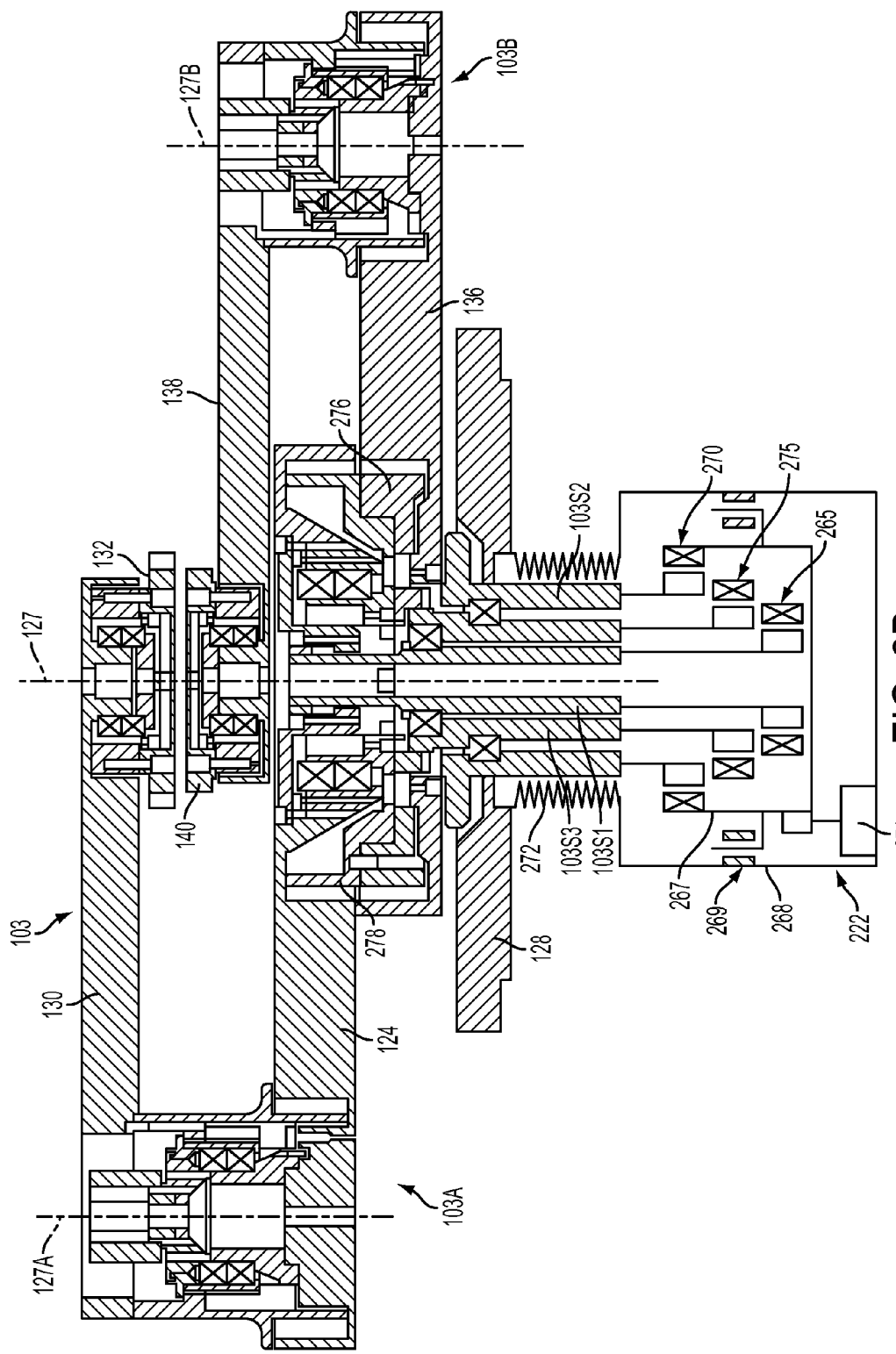

SUBSTRATE DEPOSITION SYSTEMS, ROBOT TRANSFER APPARATUS, AND METHODS FOR ELECTRONIC DEVICE MANUFACTURING

RELATED APPLICATIONS

The present application claims priority from U.S. Provisional Patent Application Ser. No. 61/879,076, filed Sep. 17, 2013, entitled "SUBSTRATE DEPOSITION SYSTEMS, ROBOT TRANSFER APPARATUS, AND METHODS FOR ELECTRONIC DEVICE MANUFACTURING", and also from U.S. Provisional Patent Application Ser. No. 61/868,795, filed Aug. 22, 2013, entitled "SUBSTRATE DEPOSITION SYSTEMS, ROBOT TRANSFER APPARATUS, AND METHODS FOR ELECTRONIC DEVICE MANUFACTURING", and also from U.S. Provisional Patent Application Ser. No. 61/787,117, filed Mar. 15, 2013, entitled "SUBSTRATE DEPOSITION SYSTEMS, APPARATUS AND METHODS FOR ELECTRONIC DEVICE MANUFACTURING", all of which are hereby incorporated herein by reference in their entirety for all purposes.

FIELD

The present invention relates to electronic device manufacturing, and more specifically to apparatus, systems, and methods for movement of substrates between chambers.

BACKGROUND

Conventional electronic device manufacturing systems may include multiple process chambers arranged around a mainframe section and one or more load lock chambers. Such electronic device manufacturing systems may be included in cluster tools. These electronic device manufacturing systems and tools may employ a transfer robot, which may be housed in the transfer chamber, for example, and that is adapted to transport substrates between the various process chambers and one or more load lock chambers. For example, the transfer robot may transport substrates from process chamber to process chamber, from load lock chamber to process chamber, and vice versa. Rapid and precise transport of substrates between the various chambers may provide efficient system throughput, thereby lowering overall operating costs. Although such existing systems and apparatus include sufficient throughput, addition throughput gains are sought.

Accordingly, systems, apparatus, and methods having improved efficiency in the processing and transfer of substrates are desired.

SUMMARY

In one aspect, an electronic device processing system is provided. The electronic device processing system includes a mainframe housing including a transfer chamber, a first facet, a second facet opposite the first facet, a third facet, and a fourth facet opposite the third facet; a first carousel assembly coupled to a first facet, a second carousel assembly coupled to the third facet, a first load lock coupled to the second facet, a second load lock coupled to the fourth facet, and a robot adapted to operate in the transfer chamber to exchange substrates from both of the first carousel and the second carousel.

In another aspect, a method of transporting substrates within an electronic device processing system is provided. The method includes providing a mainframe housing including a transfer chamber, a first facet, a second facet opposite the first facet, a third facet, and a fourth facet opposite the third facet, providing a first carousel assembly coupled to a first facet, providing a first load lock coupled to the second facet, providing a robot adapted to operate in the transfer chamber to exchange substrates from the first carousel, and simultaneously or sequentially placing a first substrate into the first carousel and a second substrate into the first load lock.

In another aspect, a multi-axis robot is provided. The multi-axis robot includes a first SCARA including a first upper arm adapted to rotate about a shoulder axis, a first forearm rotationally coupled to the first upper arm at an outboard end of the first upper arm, a first wrist member rotationally coupled to the first forearm at a first outer location of the first forearm, and a first end effector coupled to the first wrist member, a second SCARA including a second upper arm adapted to rotate about the shoulder axis, a second forearm rotationally coupled to the second upper arm at an outboard end of the second upper arm, a second wrist member rotationally coupled to the second forearm at a second outer location of the second forearm, and a second end effector coupled to the second wrist member, wherein the first end effector of the first SCARA extends in a first direction from the shoulder axis, and the second SCARA extends in a second direction from the shoulder axis, wherein the second direction is opposite the first direction.

In another aspect, an electronic device processing system is provided. The electronic device processing system includes a mainframe housing including a transfer chamber, a process chamber coupled to a first facet of the mainframe housing, a load lock coupled to another facet of the transfer chamber at a position generally opposed from the first facet, and a robot including a first SCARA robot containing a first end effector and a second SCARA robot with a second end effector, the first and second end effectors adapted to move within the transfer chamber to exchange substrates between the process chamber and the load lock wherein the first end effector and the second end effector are operable to extend and retract along substantially co-parallel lines of action.

Numerous other aspects are provided in accordance with these and other embodiments of the invention. Other features and aspects of embodiments of the present invention will become more fully apparent from the following detailed description, the appended claims, and the accompanying drawings.

BRIEF DESCRIPTION OF THE DRAWINGS

FIG. 2B illustrates a cross-sectioned side view of a multi-axis robot apparatus according to embodiments.

DETAILED DESCRIPTION

Figure 1A:
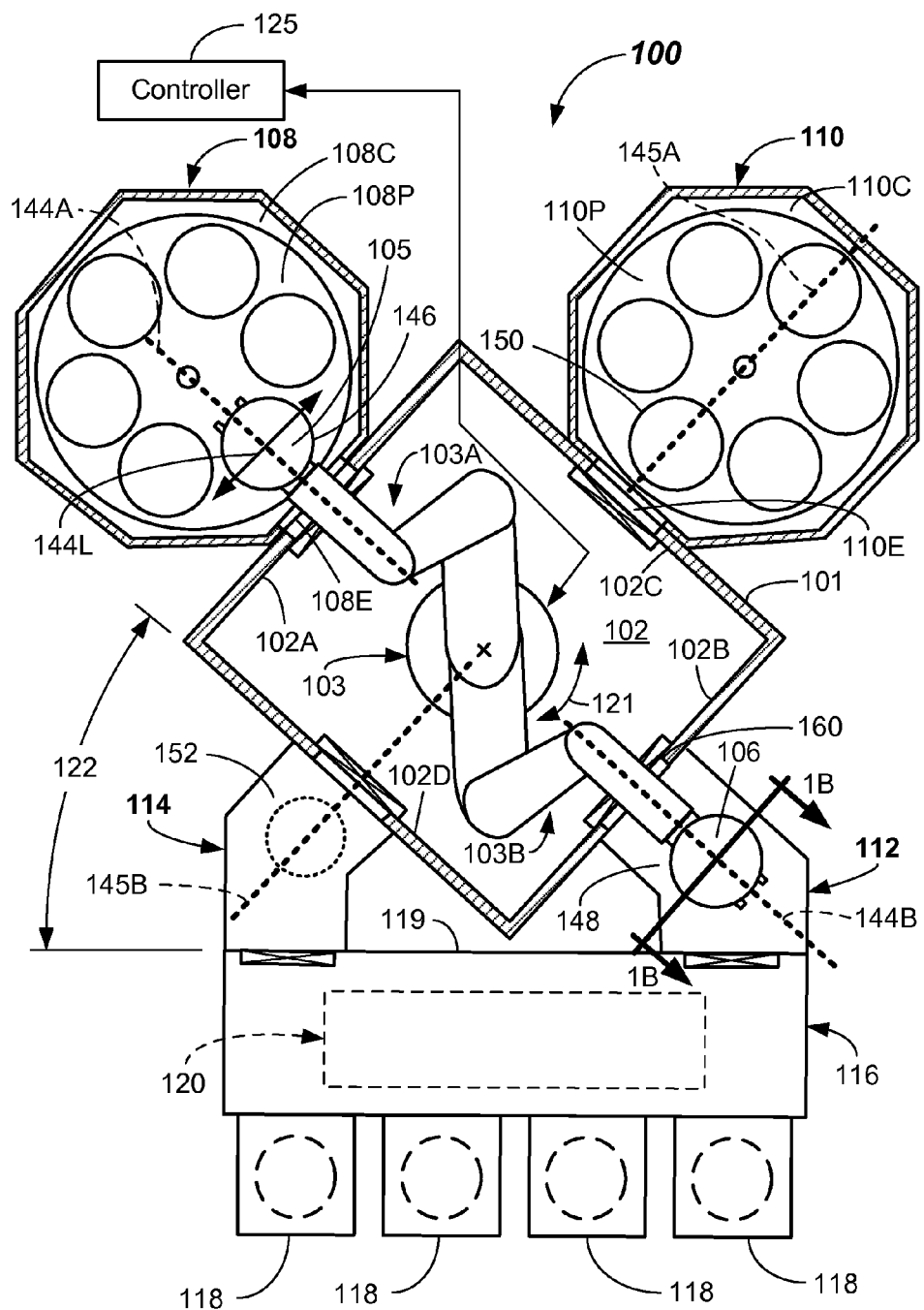
FIG. 1A illustrates a partially cross-sectioned schematic top view (with chamber tops removed) of an electronic device processing system including a multi-axis robot apparatus according to embodiments.

Electronic device manufacturing may require very precise and rapid transport of substrates between various locations. In particular, in some embodiments, end effectors (sometimes referred to as "blades") may be attached to an arm of the robot and may be adapted to transport substrates resting upon the end effectors to and from chambers of an electronic device processing system. Such electronic device manufacturing systems may include multi-axis robots arranged in a transfer chamber including such end effectors. This allows a first substrate to be extracted from a chamber, and then replaced at the same chamber with a second wafer. The goal is to achieve this transfer as rapidly as possible. However, existing multi-axis robots may not be able to make the transfer without substantial other robot moves. These additional moves may increase the overall transfer speed that is possible. Moreover, exiting robots may be limited in the way in which they can access such chambers. Furthermore, misalignment adjustment capability may be limited in some prior art systems including robots.

Furthermore, it is desirable to use a selective compliance assembly robot arm (SCARA) robot, if possible, due to its simple construction.

Therefore, in one or more embodiments, a multi-axis robot apparatus that may be used for transporting substrates to and from process chambers (e.g., carousels) and load locks in electronic device manufacturing is provided.

According to one or more embodiments of the invention, an improved multi-axis robot apparatus is provided. The inventive multi-axis robot apparatus includes dual SCARAs that are operable along respective substantially co-parallel lines of action in opposite directions such that the loading and unloading of a process chamber of a carousel and of a load lock can be accomplished substantially simultaneously. In one or more additional embodiments, each of the SCARA robots may be independently controlled to extend and retract along the line of action. In this manner, substrate misalignment correction may be carried out independently at the loading chamber of the carousel and/or at the load lock. This provides capability of fast swaps of substrates (e.g., silicon wafers) between a load lock and the opposing loading process chamber of the carousel. In particular, the independent control along the substantially co-parallel lines of action, according to one or more embodiments, may provide the ability for different radial extension distances for each end effector and/or sequentially entering and retracting from the chambers (without a rotational move of the robot). Moreover, the multi-axis robot apparatus may be operable, as will be apparent from the following description, to service a first opposed pair of a first carousel and first load lock, and a second opposed pair of a second carousel and second load lock. Accordingly, the multi-axis robot apparatus is more fully utilized than in prior carousel system configurations, as one carousel may be processing while the other is being unloaded/reloaded, and vice versa.

According to one or more embodiments of the invention, electronic device processing systems including the multi-axis robot apparatus are provided. According to one or more additional embodiments of the invention, methods of transferring substrates with an electronic device processing system are provided. The multi-axis robot apparatus is adept at transferring substrates between a multi-station carousel and a multi-position load lock, for example. The multi-station carousel and a multi-position load lock may be arranged in a diamond platform configuration, which may provide improved serviceability. For example, excellent serviceability of the mainframe housing, carousels, chambers of the carousel, and load locks may be provided. Moreover, the diamond platform configuration may provide reduced area floor footprint.

Further details of example embodiments of the invention are described with reference to FIGS. 1A-9B herein.

FIG. 1A is a schematic diagram of an example embodiment of an electronic device processing system 100 according to embodiments of the present invention. The electronic device processing system 100 may include a mainframe housing 101 having walls defining a transfer chamber 102. A multi-axis robot apparatus 103 in accordance with another embodiment of the invention may be at least partially housed within the transfer chamber 102. The multi-axis robot apparatus 103 may be configured and adapted to place or extract substrates (e.g., first substrate 105, and second substrate 106) to and from destinations via operation of the multi-axis robot apparatus 103, which is described fully below.

The destinations for the substrates 105, 106 may be at least a first carousel 108 and first load lock 112, but may also include a second carousel 110, and a second load lock 114. The carousels 108, 110 may each have a carousel chamber 108C, 110C and a rotating carousel platform 108P, 110P having multiple substrate placement locations thereon (e.g., three or more, four or more, five or more, or even six or more). The carousels 108, 110 include one or more process chambers that are coupled to the transfer chamber 102 via the entrances 108E, 110E. Process chambers within the carousel chambers 108C, 110C may be adapted to carry out any number of processes, such as atomic layer deposition (ALD), or the like on the substrates placed in the carousels 108, 110. Other processes may also be carried out therein. Processes are carried out as the substrates are rotated about on stations of the carousel platforms 108P, 110P.

The load locks 112, 114 may be adapted to interface with a factory interface 116, which may receive one or more substrates from substrate carriers 118 docked at load ports of the factory interface 116. Substrates may be transferred by a load/unload robot 120 (shown dotted) in the factory interface 116 and the transfer may take place in any sequence or direction. Load/unload robot 120 in the factory interface 116 may be entirely conventional. Substrates as used herein shall mean articles used to make electronic devices or circuit components, such as silica-containing wafers, glass discs, masks, or the like.

The electronic device processing system 100 of FIG. 1A includes two carousels (e.g., 108, 110) and two load locks (112, 114) as shown being generally opposed from one another. The carousels 108, 110 may include multiple stations on the platforms 108P, 110P upon which substrates may be supported as they undergo processing. The load locks 112, 114 may include multiple substrate supports upon which substrates may be supported, to be described later herein.

In this embodiment, the respective facets 102B and 102D of the load locks 112, 114 are oriented at an angle 122 to the interface wall 119 of the factory interface 116, as shown. The angle 122 may be approximately 45 degrees (e.g., to the interface wall 119 of the factory interface 116. This so-called "diamond platform configuration" may allow a simultaneous exchange of substrates at the first carousel 108 and first load lock 112 along substantially co-parallel lines of action 144A, 144B. Additionally, this diamond platform configuration may allow a simultaneous exchange at the second carousel 110 and second load lock 114 along respective substantially co-parallel lines of action 145A, 145B. As will be apparent, in other embodiments, the exchanges at the first carousel 108 and load lock 112 (and second carousel 110 and load lock 114) may be sequential, i.e., one after the other) thereby allowing for misalignment correction. Other angles 122 may be used, such as between about 30 degrees and 60 degrees, for example. As should be apparent, the diamond platform configuration allows the multi-axis robot 103 to service each of the first carousel 108 and load lock 112 and the second carousel 110 and load lock 114.

In some embodiments, the transfer chamber 102 may be operated under a vacuum, for example. Each of the carousels 108, 110 and the load locks 112, 114 may include slit valves at their ingress/egress, which may be adapted to open and close when placing or extracting substrates to and from the chambers thereof. Slit valves may be of any suitable conventional construction, such as L-motion slit valves. In some embodiments, the slit valves at the entrances to the respective load locks 112, 114 may be double height to enable the different height end effectors of the SCARAs 103A, 103B to readily access the load lock 112, 114 without a vertical height change of the robot 103.

The motion of the various components of the multi-axis robot apparatus 103 may be controlled by suitable commands to a drive assembly (not shown) containing a plurality of drive motors of the multi-axis robot apparatus 103 from a controller 125. Controller 125 may be any suitable electronic controller having processor, memory, and suitable electronic components adapted to process and send signals to the drive motors. Signals from the controller 125 may cause motion of the various components of the multi-axis robot apparatus 103, as will be apparent from the following. Suitable feedback may be provided for each component by various sensors, such as position encoders, or the like.

The diamond platform configuration may accommodate different multi-axis robot types, such as the robots described in U.S. Pat. Nos. 5,789,878; 5,879,127; 6,267,549; 6,379,095; 6,582,175; and 6,722,834; and US Pat. Pubs. 2010/0178147; 2013/0039726; 2013/0149076; 2013/0115028; and 2010/0178146, for example. Other suitable robot types may be used in place of the robot 103 shown.

In one particular embodiment described herein, the multi-axis robot apparatus 103 may include three motors as shown in FIG. 2B. A first motor 265 may be used to rotate a first shaft 103S1 of the multi-axis robot apparatus 103 about the shoulder axis 127 as shown in FIG. 2B. This rotation extends or retracts the wrist member 132 of the first SCARA robot 103A along the line of action 144A.

A second motor 270, which may be positioned above the first motor 265, may be used to rotate a second shaft 103S2 of the multi-axis robot apparatus 103. This rotation extends or retracts the wrist member 140 of the second SCARA robot 103B along a second line of action 144B, which may be substantially co-parallel with line of action 144A.

A third motor 275, which may be positioned between the first and second motors 265, 270, may be used to rotate a third shaft 103S3 of the multi-axis robot apparatus 103. This rotation rotates the pulleys 276, 278 which are coupled together in this embodiment, and causes SCARA robots 103A and 103B to rotate in unison about the shoulder axis 127, as shown by directional arrow 121 (FIG. 1A). This rotational move may be used to accomplish a swap of substrates between the respective carousel 108, 110 and a corresponding radially-opposed load lock 112, 114. Rotation of the first and second shafts 103S1, 103S2 may be used to extend and retract each of the SCARAs 103A, 103B along the substantially co-parallel lines of action 144A, 144B (shown dotted). During this extension and retraction, the third motor 275 and shaft 103S3 remain stationary.

In one embodiment, the first and second motors 265, 270 may be controlled and operated independently to control the extension and retraction of the first SCARA 103A and the second SCARA robot 103B along the lines of action 144A, 144B, 145A, 145B. Thus, an amount and direction of extension and retraction may be independently controlled along the respective lines of action 144A, 144B, 145A, 145B.

In another embodiment, the first and second motors 265, 270 may controlled to cause simultaneous extension and retraction of the first and second SCARA robots 103A, 103B. Thus, the end effectors 134, 142 (FIG. 2A) of the first and second SCARA robots 103A, 103B may either independently extend and retract into radially-opposed chambers, or may simultaneously extend into radially-opposed chambers.

As shown in FIGS. 2A-2F, the multi-axis robot apparatus 103 includes the first SCARA robot 103A and the second SCARA robot 103B. The first SCARA robot 103A includes a first upper arm 124 rotatable about a shoulder axis 127.

The multi-axis robot apparatus 103 may include a base 128 that is adapted to be attached to a wall (e.g., a floor) of the mainframe housing 101. However, the multi-axis robot apparatus 103 may be attached to a ceiling of the mainframe housing 101 in some embodiments. Accordingly, the multi-axis robot apparatus 103 may be at least partially supported by the mainframe housing 101.

The multi-axis robot apparatus 103 may also include a drive assembly 222 (FIG. 2B) which may be located outside of the transfer chamber 102 and that may be configured and adapted to drive the upper arm 124 and various other arms and components to be described herein. Again referring to FIG. 2A, the upper arm 124 may be adapted to be rotated about the shoulder axis 127 in either a clockwise or counterclockwise rotational direction. The rotation may be provided by any suitable drive motor, such as a conventional variable reluctance or permanent magnet electric motor located in the drive assembly 222 (see FIG. 2B). The rotation of the upper arm 124 may be controlled by suitable commands to the drive motor from the controller 125. Upper arm 124 is adapted to be rotated in an X-Y plane relative to the base 128 about the shoulder axis 127.

Figure 2A:
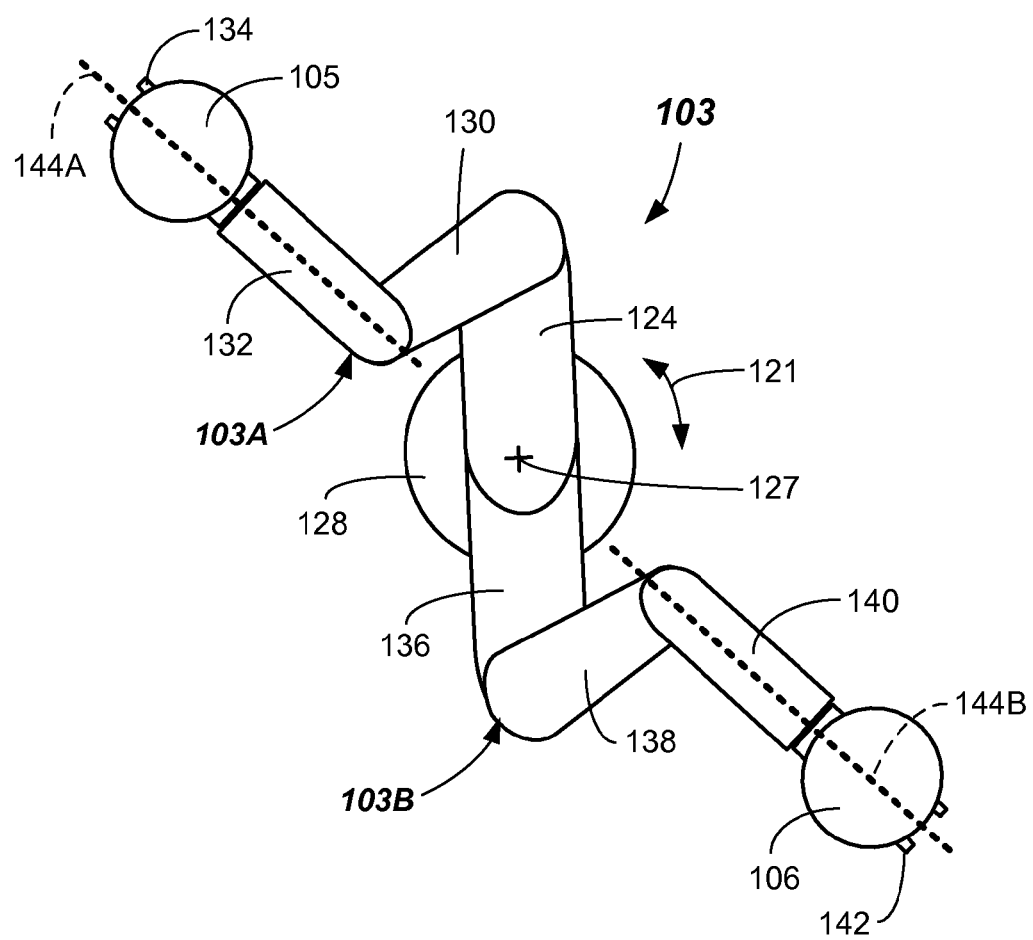
FIG. 2A illustrates a top plan view of a multi-axis robot apparatus according to embodiments, shown in isolation.
Figure 2C:
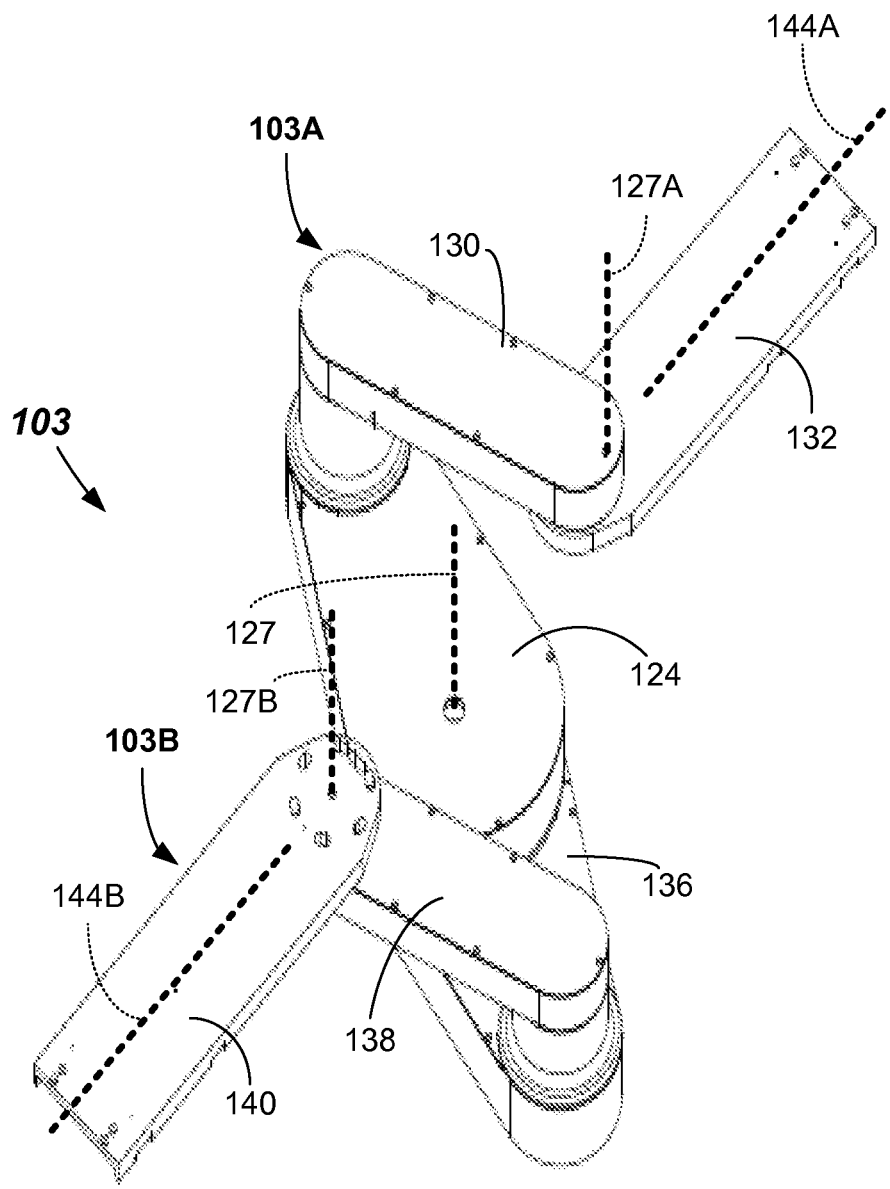
FIG. 2C illustrates a perspective view of a multi-axis robot apparatus according to embodiments with the end effectors removed.
Figure 2D:
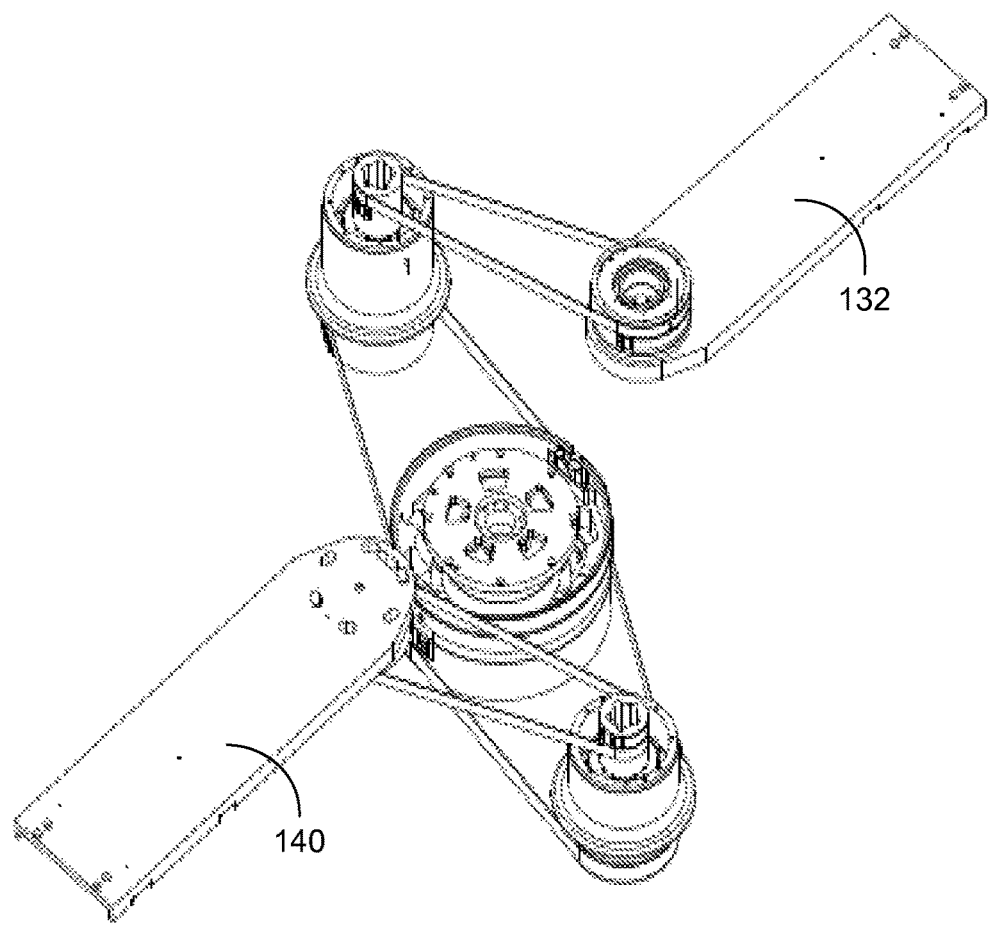
FIG. 2D illustrates a perspective view of a multi-axis robot apparatus of FIG. 2C according to embodiments, with some arms removed to reveal the drive components and with end effectors removed.

In the depicted embodiment of FIGS. 2A and 2B, the robot apparatus 103 includes, in first SCARA 103A, first forearm 130, which may rotationally couple to the upper arm 124 at a radially outboard end of the upper arm 124 spaced from the axis 127. In the depicted embodiment, the first forearm 130 is mounted to a first outboard end of the upper arm 124 at the outboard location and is rotatable about a second rotational axis 127A. Rotation of the first forearm 130 may be +/− about 150 degrees relative to the first upper arm 124. The rotation of the first forearm 130 may be kinematically linked through a drive components (e.g., pulleys and belts as shown in FIGS. 2B and 2D) so that rotation of the first upper arm 124 causes a corresponding kinematic rotation of the first forearm 130.

Furthermore, a first wrist member 132 may be coupled to a first outer location on the first forearm 130 and is rotatable relative to the first forearm 130 about a first wrist axis. The first wrist axis may be spaced from the second rotational axis 127A by a distance. The first wrist member 132 may have a first end effector 134 coupled thereto. First end effector 134 is configured and adapted to carry the substrate 105 to be processed within the substrate processing system 100. Rotation of the first wrist member 132 and thus the coupled first end effector 134 relative to the first forearm 130 may be +/− about 150 degrees. The first upper arm 124, first forearm 130, first wrist member 132 and first end effector 134, and the corresponding drive motors and drive shafts included in the drive assembly 222 make up the first SCARA robot 103A. The rotation of the first upper arm 124, first forearm 130, and the first wrist member 132 may be kinematically linked through drive components (e.g., belts and pulleys) so that rotation of the first upper arm 124 causes a corresponding rotation of the first forearm 130 which causes a corresponding rotation of the first wrist member 132 such that the first end effector 134 purely translates along the line of action 144A when third motor 275 remains stationary.

SCARA is defined herein as a selective compliance articulated robot assembly, and refers to a robot whose arms (e.g., first upper arm 124, first forearm 130, and first wrist member 132) are kinematically linked so that rotations of the first upper arm 124 causes corresponding rotations of the first forearm 130, and first wrist member 132 causing the end effector 134 to purely translate along a line of action 144A, i.e., along a radial line aligned with the shoulder axis 127.

Figure 5:
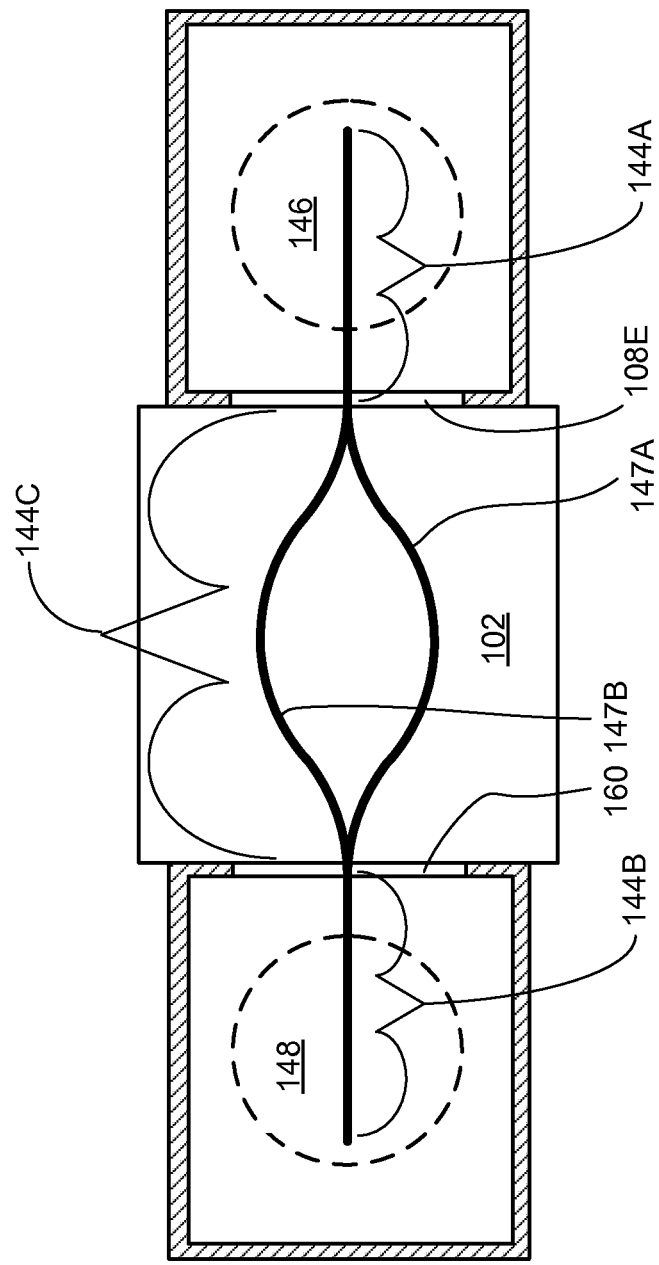
FIG. 5 illustrates one transfer path that may be carried out by the end effectors of the electronic device processing system when executing a rotational move (swap move) according to embodiments.

The end effector 134 may depart from this line of action 144A when undergoing a rotational move to accomplish the swap as shown in FIG. 5. This departure from the line of action 144A may be caused by moving the third motor 275 as soon as the centerline of the substrate (e.g., 105) exits the exit 108E from the carousel 108, as well as by the end effector over wrist configuration shown in FIGS. 2E, 2G and 6A-7B, as described herein.

Again referring to FIGS. 2A-2F, the robot apparatus 103 includes, on the second SCARA robot 103B, a second upper arm 136 rotatable about the shoulder axis 127, a second forearm 138, which may coupled to the second upper arm 136 at a radially outboard end of the upper arm 136 spaced from the shoulder axis 127. In the depicted embodiment, the second forearm 138 is mounted to a first outboard end of the second upper arm 136 at the outboard location and is rotatable about a second rotational axis 127B. Rotation of the second forearm 138 may be +/− about 150 degrees relative to the second upper arm 136.

Furthermore, a second wrist member 140 may be coupled to a first outer location on the second forearm 138 and is rotatable relative to the second forearm 138 about a second wrist axis. The second wrist axis may be spaced from the second rotational axis 127B by a distance. The second wrist member 140 may have a second end effector 142 coupled thereto.

Second end effector 142 is configured and adapted to carry the substrate 106 to be processed within the substrate processing system 100. Rotation of the second end effector 142 relative to the second forearm 138 may be +/− about 150 degrees. The second upper arm 136, second forearm 138, second wrist member 140 and second end effector 142, and the corresponding drive motors and drive shafts included in the drive assembly 222 make up a second SCARA robot 103B.

The second upper arm 136, second forearm 138, and the second wrist member 140 may be kinematically linked through a drive components (e.g., belts and pulleys as shown in FIGS. 2B and 2D) so that rotation of the first upper arm 136 causes a corresponding rotation of the second forearm 138, which causes a corresponding rotation of the second wrist member 140.

Each of the first and second SCARA robots 103A, 103B may be driven by a drive assembly 222, which in one embodiment, may be mounted outside of the transfer chamber 102. In this embodiment, rotation of a first drive motor 265 in a clockwise direction retracts end effector 134 towards the shoulder axis 127 along the line of action 144A (as shown. Rotation of a second drive motor 270 in a clockwise direction retracts the end effector 142 along the line of action 144B. Extension may be accomplished by counterclockwise rotation. Extension and retraction may be along substantially co-parallel lines of action 144A, 144B when positioned to perform a swap between carousel 108 and load lock 112 as shown in FIG. 1A. The drive components (belts, pulleys as shown in FIGS. 2B and 2D and upper arm and forearm lengths) are chosen to ensure linear extension and retraction motion along the respective lines of action 144A, 144B. The first and second drive motors 265, 270 in the drive assembly 222 may couple to drive components and may be adapted to translate the end effectors 134, 142 either simultaneously or sequentially. In sequential motion, either one of the robots 103A, 103B may be first extended or retracted independently of the other after or before a rotational move.

Suitable conventional rotational encoders (not shown) may be used to position the SCARA robots 103A, 103B relative to the carousels 108, 110 and the load locks 112, 114, as desired.

Additionally, as shown in FIG. 2B, the drive assembly 222 may include Z-axis motion capability in some embodiments. In particular, a motor housing 267 of the drive assembly 222 may be restrained from rotation relative to an outer casing 268 by a motion restrictor 269. Motion restrictor 269 may be two or more linear bearings or other bearing or slide mechanisms that function to constrain rotation of the motor housing 267 relative to the outer casing 268, yet allow Z-axis motion of the motor housing 267 (along the direction of the shoulder rotational axis 127).

The vertical motion may be provided by a suitable vertical motor 271. Rotation of the vertical motor 271 may operate to rotate a lead screw in a receiver coupled to, or integral with, the motor housing 267. This vertically translates the motor housing 267, and, thus, the end effectors 134, 142, and, thus, the substrates 105, 106. A suitable flexible seal 272 may seal between the motor housing 267 and the base 128 thereby accommodating the vertical motion and retaining the vacuum within the transfer chamber 102. A metal bellows or other like flexible seal may be used for the seal.

In one embodiment, the first and second SCARA robots 130A, 103B may be independently driven in extension and retraction. In this "independently driven" embodiment, each of the first and second SCARA robots 103A, 103B may be extended and retracted independently of each other. Thus, first SCARA robot 103A may be retracted when second SCARA robot 103B is being extended, or vice versa. Furthermore, in another motion sequence, the first and second SCARA robots 103A, 103B may be extended together or retracted together, yet by different amounts along the respective lines of action 144A, 144B. In other embodiments, the first and second SCARA robots 103A, 103B may be extended and retracted simultaneously along the respective lines of action 144A, 144B, and in a same amount.

As stated above, in some rotational moves undertaken to rotate the end effectors 134, 142 to another destination, the end effectors 134, 142, and substrates 105, 106 supported thereon, may depart from the linear lines of action 144A, 144B as shown in FIG. 5.

Figure 2E:
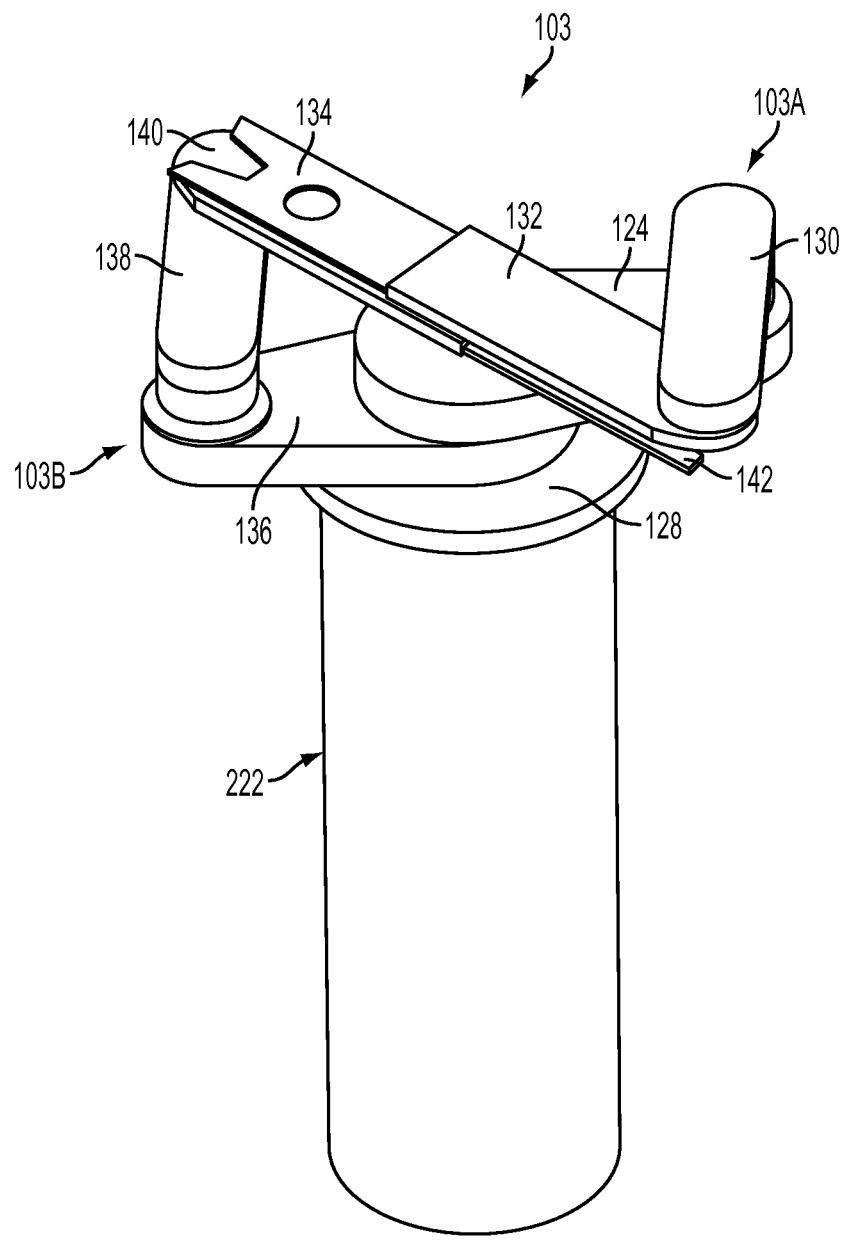
FIG. 2E illustrates a perspective view of a multi-axis robot apparatus according to embodiments with the end effectors being fully retracted (shown in a blade over wrist configuration) and ready for a rotational move.
Figure 2F:
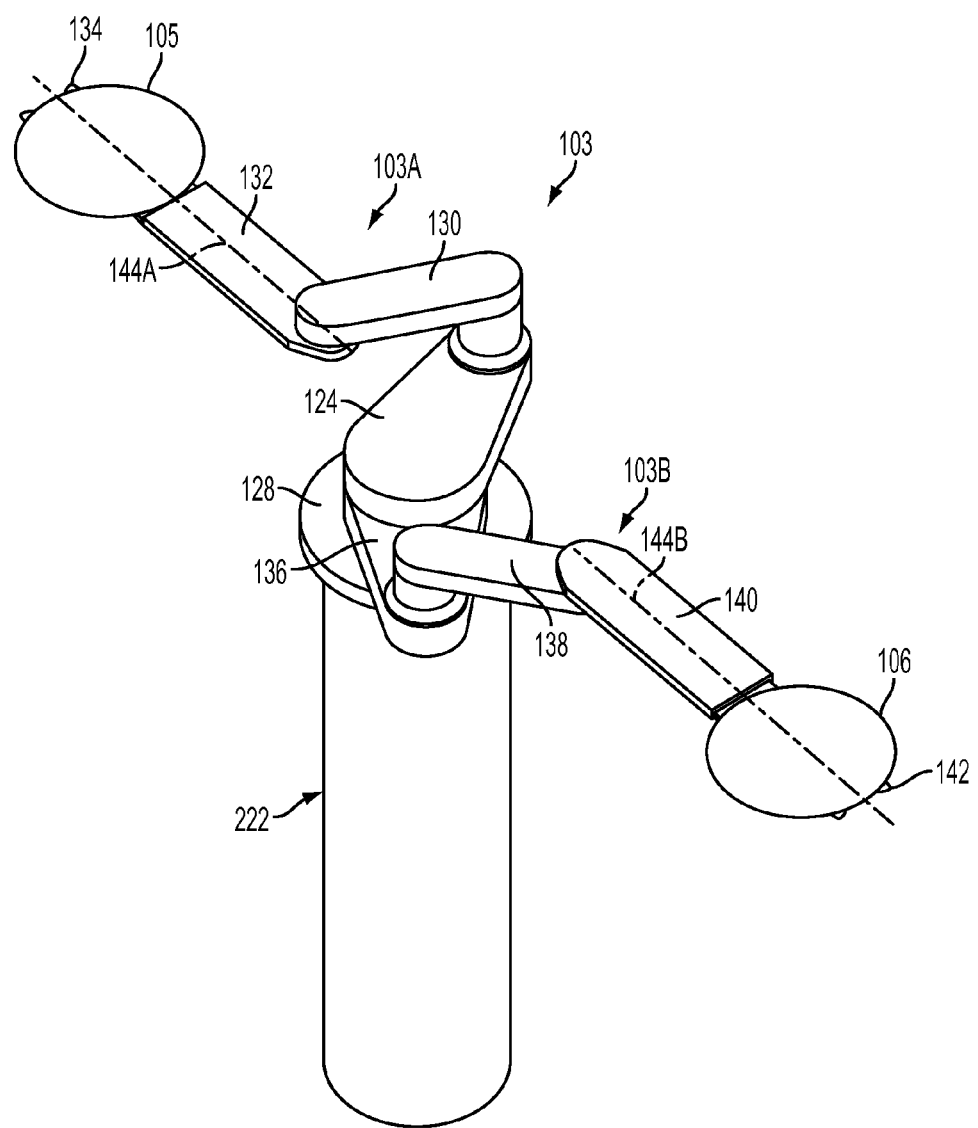
FIG. 2F illustrates a perspective view of a multi-axis robot apparatus according to embodiments with the end effectors extended along respective substantially co-parallel lines of action.
Figure 2G:
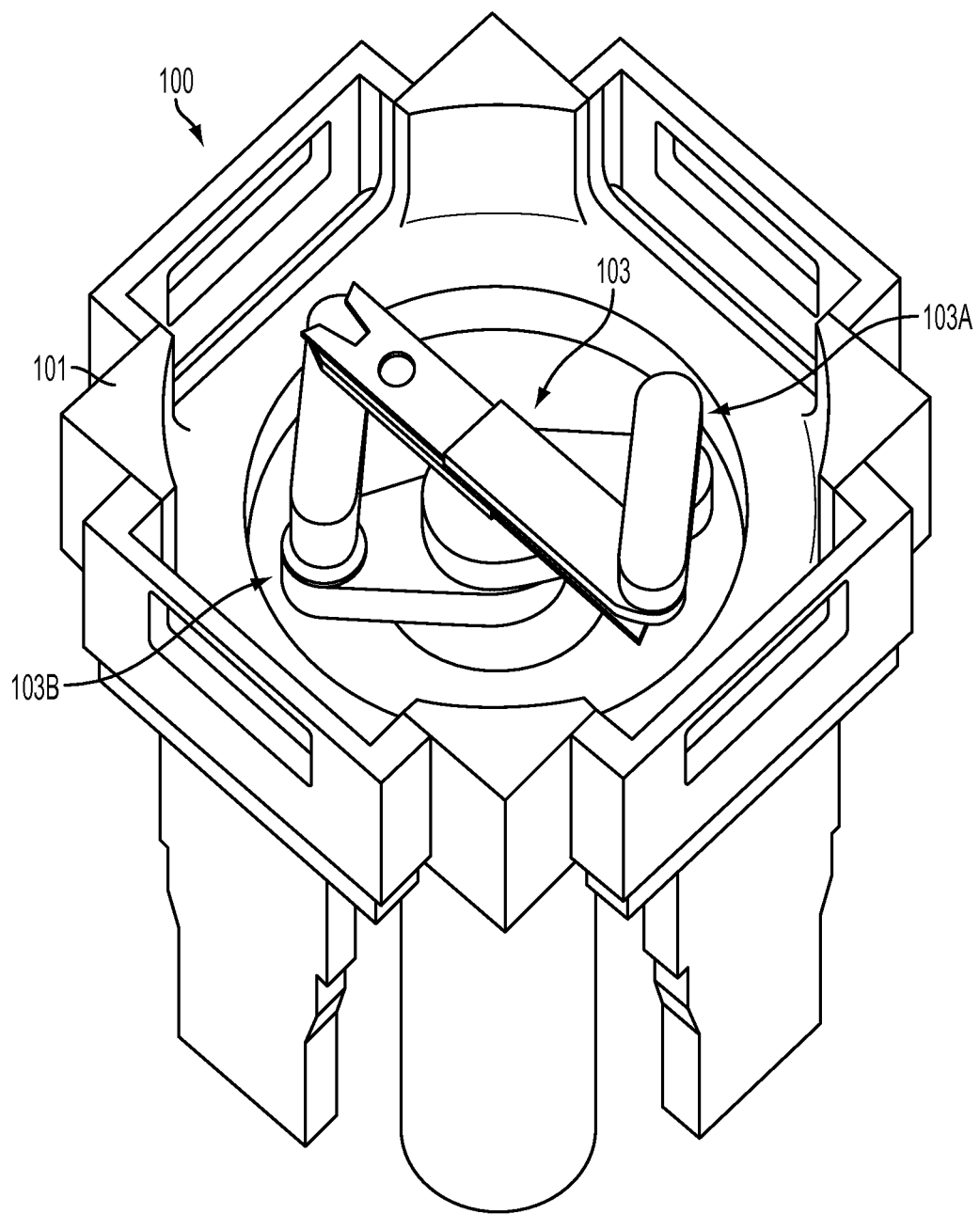
FIG. 2G illustrates a perspective view of a multi-axis robot apparatus installed in the mainframe housing with the end effectors retracted along substantially co-parallel lines of action according to embodiments.

In particular, as shown in FIG. 5, the end effectors 134, 142 of the robots 103A, 103B may follow a non-straight path 144C once more than half of each substrate 105, 106 lies within the transfer chamber 102. Thus, the end effectors 134, 142 and the supported substrates 105, 106 may undergo pure translation along lines of action 144A, 144B when extending and retracting from the chambers (e.g., generally opposed chambers) and then follow an arcuate path 144C when more than half the volume of the respective substrate 105, 106 is within the volume of the transfer chamber 102. The arcuate path 144C may include three circular arc segments (e.g., convex, concave, and convex) that may be coupled tangentially. The segments of arcuate path 144C may be carried out at substantially constant velocity. This is caused by starting the rotation move as soon as half the last substrate to be removed has cleared the respective opening 108E, 160, and providing the substrate 105, 106 in a configuration of end effector 134 over wrist member 140 as shown in FIG. 2E.

The ability to extend and retract independently provides additional capability to correct misalignment of the substrates 105, 106 when placed into a chamber (process chamber or load lock chamber). This embodiment, although described with relationship to a carousel 108 and load lock 112 may be used for accessing and/or misalignment correction in one or both of any two radially-aligned chambers.

Figure 4:
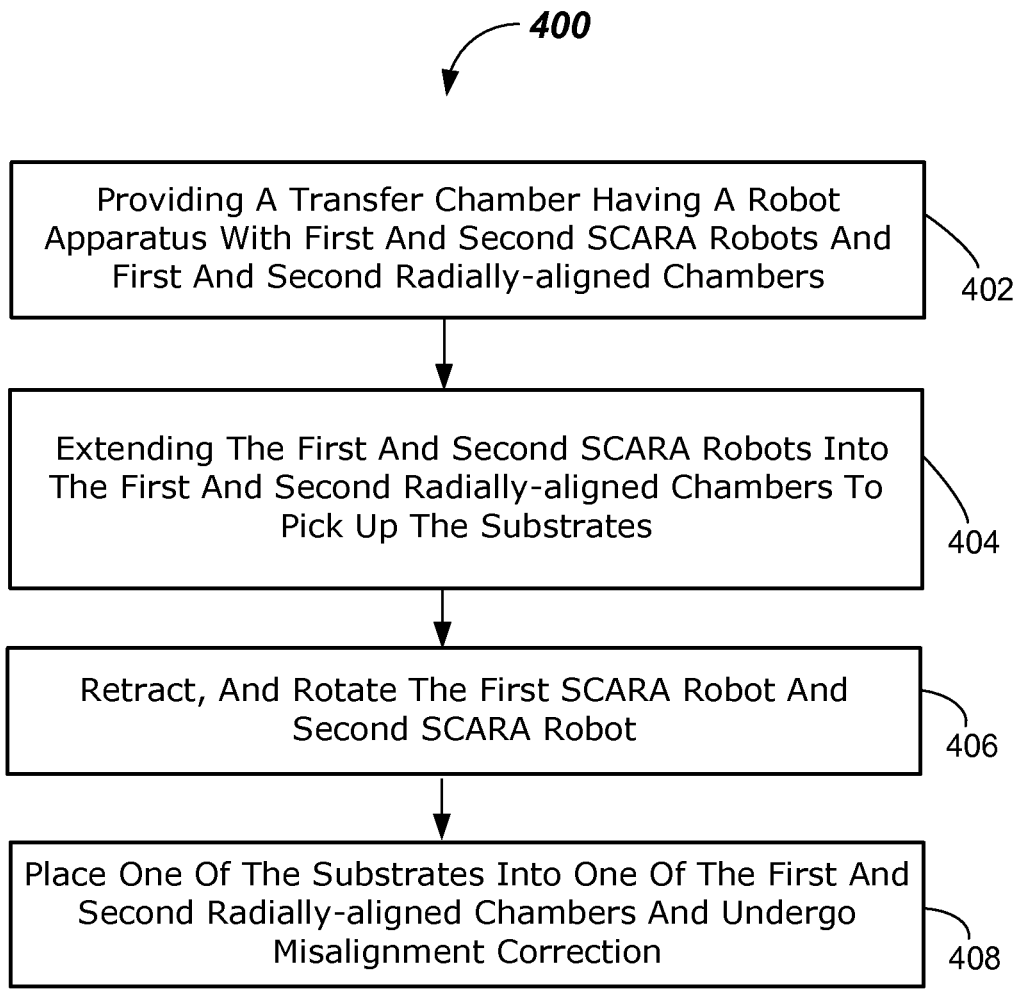
FIG. 4 illustrates a flowchart depicting another method of transporting substrates within an electronic device processing system according to embodiments.

For example, referring to FIG. 1A and FIG. 4 herein, a method of exchanging substrates (e.g., substrates 105, 106) is provided. The method 400 includes, in 402, providing a transfer chamber (e.g., transfer chamber 102) including a robot apparatus (e.g., robot apparatus 103) with first and second SCARA robots (e.g., SCARA robots 103A, 103B), and first and second radially-aligned chambers (e.g., chambers 146, 148). Chambers 146, 148 may be radially aligned across the transfer chamber 102, i.e., on opposed sides thereof. The robot apparatus 103 may be controlled via signals from controller 125 to carry out one or more substrate exchange (e.g., swap) sequences between the radially-aligned chambers (e.g., chambers 146, 148). Radially aligned chambers may be a process chamber and a load lock chamber, for example.

According to the method 400, in a first sequence, the first SCARA robot 103A may extend into the first radially-aligned chamber 146 in the carousel 108 and second SCARA robot 103B may extend into the second radially-aligned chamber 148 in the load lock 112, and pick up the substrates 105, 106 in 404. The extension may be simultaneous or independent, i.e., sequential (in any order). No rotational move is yet undertaken.

In 406, the first SCARA robot 103A and second SCARA robot 103B may simultaneously retract or sequentially retract (in any order), and then rotate. The rotational move may include rotation about directional arrow 121, either CW or CCW 180 degrees, so that substrate 106 is now radially aligned with the entrance 108E into the load/unload station of the chamber 146 of the carousel 108 and the substrate 105 is now radially aligned with the entrance 160 to the chamber 148 of the load lock 112. Rotation (e.g., the rotational move of the robot 103) may be accomplished via rotation of the third motor (e.g., motor 275). During the rotational move, the end effectors 134, 142 may follow the paths 147A, 147B along section 144C.

One of the substrates 105, 106 may be placed into one of the respective radially-aligned chambers 146, 148 and undergo misalignment correction in 408, while the other may remain positioned in the transfer chamber 102. Determining misalignment of the substrate 105, 106 within the respective chamber 146, 148 may be through any known misalignment determining scheme, such as by sensing a position of the substrate 105, 106 with optical position sensors as they enter the respective entrances (e.g., 108E, 160) of each chamber 146, 148. Once the controller 125 determines the amount and direction of misalignment, then the misalignment may be corrected by making suitable positional adjustments. Adjustments may be in the lateral direction (e.g., along direction 144L) by rotation in the direction of directional arrow 121 and/or radial direction (by further extension or retraction along line of action 144A. Similar lateral and radial misalignment corrections may be made in the load lock 112.

In one embodiment, placement and misalignment correction (if needed) of the substrate 105 into the load lock 112 may take place first, the first SCARA robot 103A may be retracted from the load lock 112 along line of action 144B, and then a misalignment correction may take place within the chamber 146 of the carousel 108 by inserting the end effector 142 into the chamber 146 and causing a slight rotation of the robot apparatus 103 about directional arrow 121 to correct lateral misalignment in the lateral direction 144L and/or a slight extension or retraction of the second SCARA robot 103B to correct misalignment along the line of action 144A, as needed.

In other embodiments, misalignment may be subsequently corrected when placed into the load lock 112, using a similar misalignment correction sequence. In some embodiments, misalignment may be corrected in both the carousel 108 and in the load lock 112. Misalignment correction within the carousel 108 and load lock 112 may take place in any order. Similar exchanges and misalignment correction may take place in chamber 150 of carousel 110 and/or in chamber 152 of load lock 114. Load locks 114 and 112 may be substantially identical in structure and function. Likewise, carousels 108 and 110 may be substantially identical in structure and function. Other configurations may be used.

Figure 3:
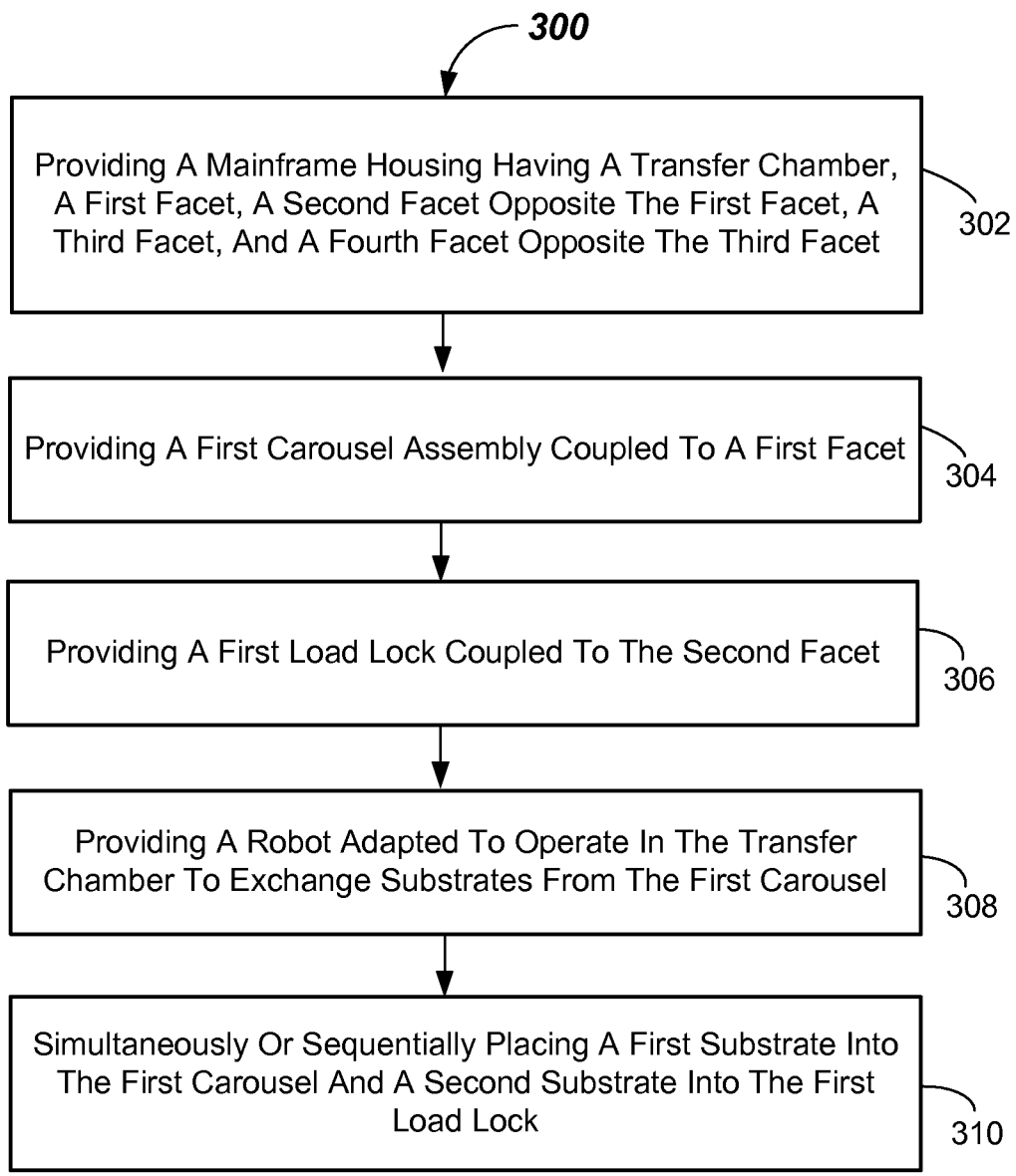
FIG. 3 illustrates a flowchart depicting a method of transporting substrates within an electronic device processing system according to embodiments.

In another embodiment, a method 300 of transporting substrates (e.g., 105, 106) within an electronic device processing system (e.g., 100) is provided in FIG. 3. The method 300 includes, in 302, providing a mainframe housing 101 including a transfer chamber 102, a first facet 102A, a second facet 102B opposite the first facet 102A, a third facet 102C, and a fourth facet 102D opposite the third facet 102C. The method 300 further includes, in 304, providing a first carousel assembly (e.g., carousel 108) coupled to a first facet (e.g., first facet 102A), and, in 306, providing a first load lock (e.g., first load lock 112) coupled to the second facet (e.g., second facet 102B).

The method 300 further includes, in 308, providing a robot (e.g., robot 103) adapted to operate in the transfer chamber (e.g., transfer chamber 102) to exchange substrates (e.g., substrates 105, 106) from the first carousel (e.g., first carousel 108), and in 310, simultaneously or sequentially placing a first substrate (e.g., substrate 105) into the first carousel (e.g., first carousel 108) and a second substrate (e.g., substrate 106) into the first load lock (e.g., load lock 112).

In another aspect, a second carousel 110 is coupled to the third facet (e.g., third facet 102C), and a second load lock 114 (e.g., second load lock 114) is coupled to the fourth facet (e.g., fourth facet 102D), and the robot 103 is operable to simultaneously or sequentially place a third substrate into the second carousel 110 and a fourth substrate into the second load lock 114. Robot 103 may exchange (e.g., swap) substrates between the second carousel 110 and the second load lock 114, for example.

In one or more embodiments, the robot 103 comprises a first SCARA 103A operating to extend in a first direction from a shoulder axis 127 along the line of action 144A (FIGS. 2A-2C), and a second SCARA 103B operating to extend in a second direction along a second line of action 144B from the shoulder axis 127, wherein the second direction along the line of action 144B is opposite the first direction along the line of action 144A.

In other embodiments, the first SCARA 103A is operable to extend in a first direction from a shoulder axis 127 along the line of action 144A (FIG. 2A), and a second SCARA 103B is operable to extend in a second direction from the shoulder axis 127, along the line of action 144B, but the extension may be non-simultaneous, i.e., it may be sequential. Extension may be in any order along the lines of action 144A, 144B, such as extending first SCARA robot 103A first and then extending second SCARA robot 103B second, or vice versa, without making a rotational move (except for misalignment correction).

Figure 1B:
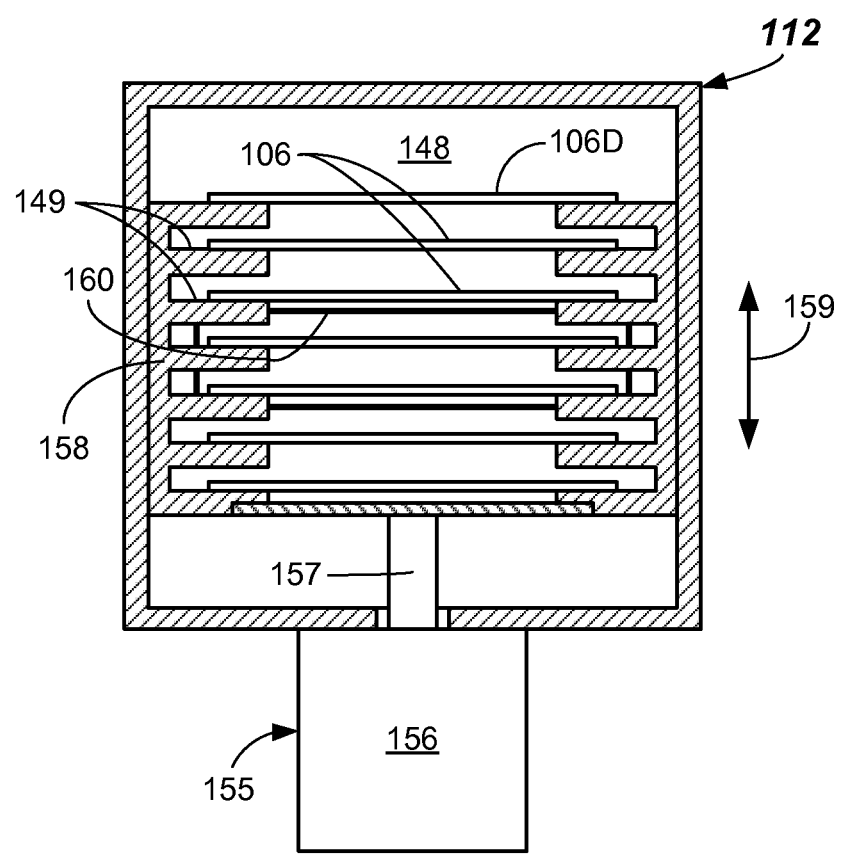
FIG. 1B illustrates a cross-sectioned side view of a batch load lock apparatus taken along section line 1B-1B of FIG. 1A according to embodiments.

In one or more embodiments, as shown in FIG. 1B, the load lock apparatus 112 may be a batch load lock apparatus and may include multiple supports 149 (such as slots or shelves—a few labeled) into which multiple substrates (e.g., substrates 106—a few labeled) may be placed. Any suitable support structure may be used. The number of supports 149 may be equal to or greater than the number of processing positions in the carousel 108. For example, if the carousel 108 has six processing positions (as shown), the load lock 112 should have six or more slots adapted to accept substrates 106, such that the entire carousel 108 may be unloaded and reloaded by opening the load lock 112 only once. In some embodiments, one or more extra slots may be provided in order to house an auxiliary substrate 106D such as a dummy wafer, calibration wafer, or the like. An endmost support position on the top or bottom may be used for the auxiliary substrate 106D.

In the depicted embodiment, the load lock 112 may include a lift assembly 155 having a lift motor 156 with a drive component 157 coupled to a movable lift body 158, which includes the supports 149. The lift assembly 155 may be operable to move the movable lift body 158 up and down along the vertical direction 159. The lifting action within the load lock chamber 148 may be operable to align a particular substrate 106 with the load lock entrance 160. Load lock entrance 160 may be a double-width entrance in some embodiments to accommodate the robot 103, which may have end effectors 134, 142 at two different levels.

Optionally, the double-width entry 160 may comprise two vertically-stacked single entrances. A single slit valve door may cover the double-width entrance 160. The use of a double-width entrance eliminates a vertical robot move at the load lock 112. Load lock 114 may also include a double-width entrance. Likewise, load lock 114 may include multi-position load lock structure enabling unloading the carousel 110 as a batch mode as described above.

In some embodiments, of the multi-position load locks 112, 114 may include active heating adapted to heat the substrates (e.g., substrate 106) to within about 100 degrees C. or less of the process temperature taking place at the respective process chambers (e.g., at the carousel 108). For example, the substrate 106 may be heated to 300 degrees C. or more in some embodiments, heated to 350 degrees C. or more, or even about 400 degrees C. or more, before being loaded into the carousel 108 by the robot 103.

Figure 6A:
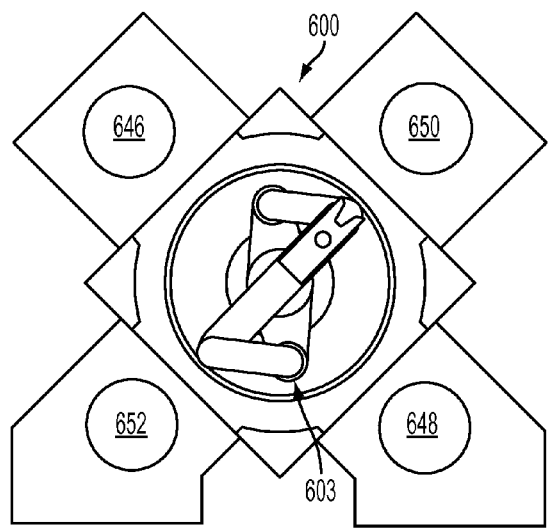
FIGS. 6A-6B illustrates top views of an electronic device processing system showing the end effector with and without a substrate thereon and in a fully-retracted configuration according to embodiments.
Figure 6B:
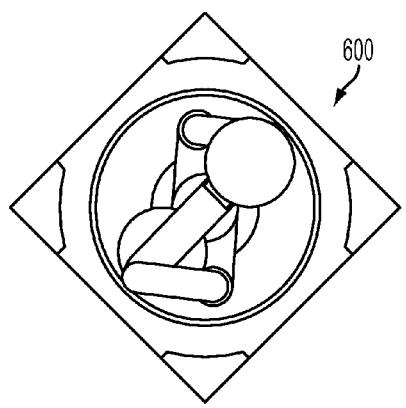

FIGS. 6A and 6B illustrate top views of an electronic device processing system 600 with a first robot 603 configured to undertake a rotational move to swap substrates between a first chamber (e.g., process chamber 646 or 650) and a second chamber (e.g., load lock chamber 648 or 652). The respective end effectors at least partially or fully overlie (lie over) or underlie (lie under) the wrist member of the other SCARA robot, as depicted. In particular, when the robot 603 is in a fully-retracted position as shown, in order to undergo a rotational move (to enable swapping) within the mainframe housing, the respective end effectors and wrist members may be positioned in a configuration where the first end effector lies at least partially vertically (or fully) in line with a wrist member of the second SCARA robot. Likewise, the second end effector may lie at least partially (or fully) vertically in line with a wrist member of the first SCARA robot. This blade-over-wrist member configuration allows the mainframe housing volume to be made smaller and reduces system footprint size. This may reduce system cost, reduce system volume, and pump down time. Similarly, the use of the diamond platform configuration, as shown improves serviceability, including mainframe and chamber access.

Figure 7A:
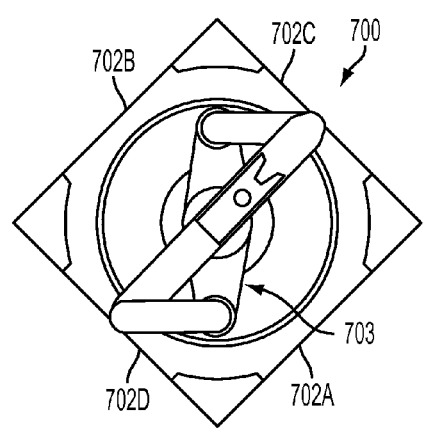
FIGS. 7A-7B illustrates top views of another embodiment of electronic device processing system showing the end effector with and without a substrate thereon and in a fully-retracted configuration according to embodiments.
Figure 7B:
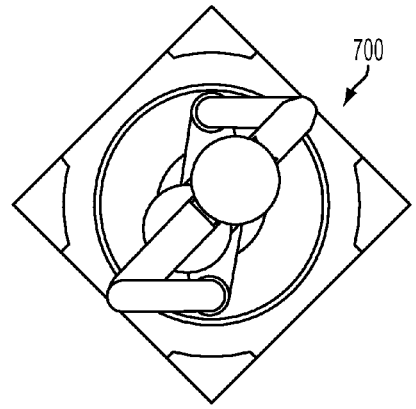

FIGS. 7A and 7B illustrates top views of an electronic device processing system 700, with the process chambers and load locks removed, having a robot 703 configured to undertake a rotational move to swap substrates between a first chamber and a second chamber coupled to facets 702C and 702D. The respective end effector lengths, forearm lengths, and upper arm lengths have been enlarged over the FIG. 6A, 6B embodiment such that the end effectors only partially overlie or underlie the wrist member of the other SCARA robot, as depicted. The ends of the forearms where they meet the respective wrist members may encroach upon (pass through the plane of each facet 702C, 702D, as shown) when in the fully-retracted condition shown, as the slit valve doors (not shown) may be retracted sufficiently at this point where the robot 703 is first undergoing the robot rotational move. This avoids interference, yet allows the robot to be made larger without making the transfer chamber larger. This further reduces the footprint size of the system, and may reduce cost and pump down volume as compared to previous end effector over end effector configurations. In the FIGS. 7A and 7B embodiments, process chambers (either individual chambers or as carousels) may be coupled to the facets 702B and 702C, and load locks may be coupled to facets 702A and 702D. Load locks may be single-position load locks or multi-position load locks as described in FIG. 1B.

Figure 8:
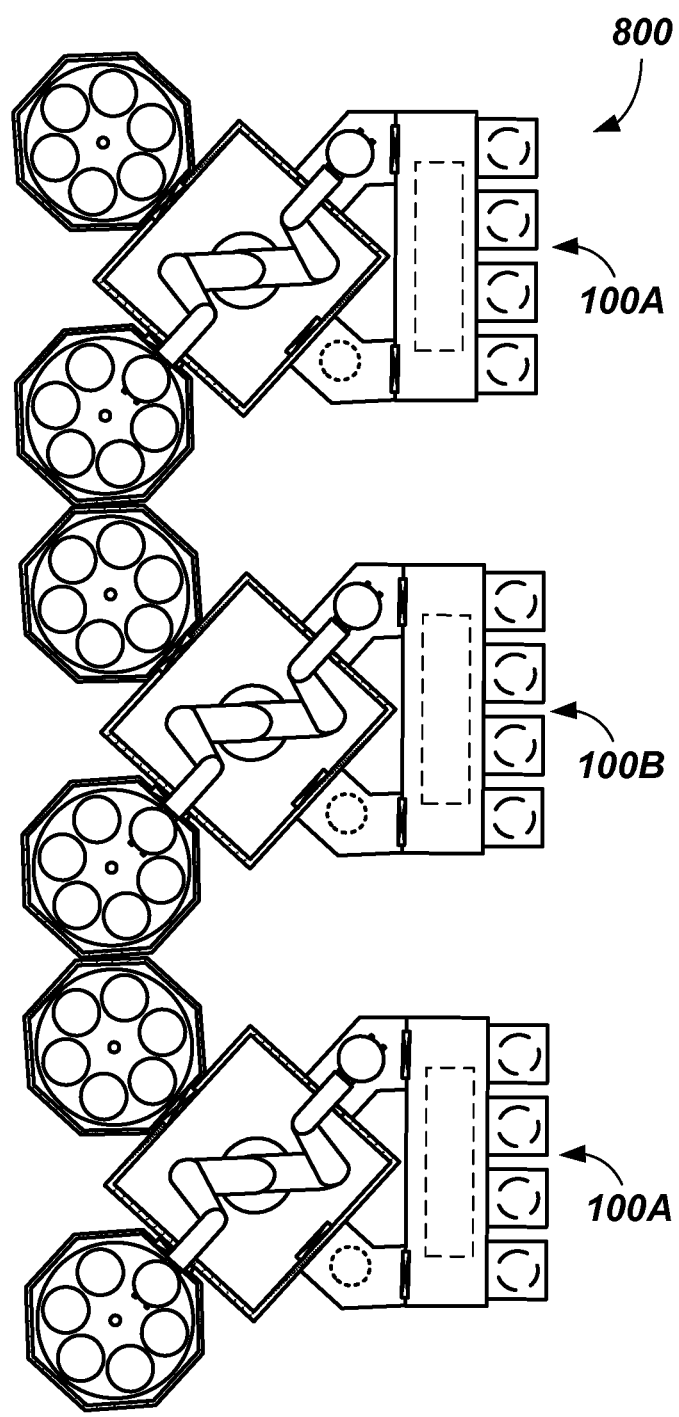
FIG. 8 illustrates a top schematic view of a manufacturing system including multiple, side-by-side oriented, electronic device processing systems illustrating a reduced width footprint of the manufacturing system according to embodiments.

FIG. 8 illustrates a manufacturing system 800 including an arrangement of three electronic device processing systems 100A, 100B, and 100C according to embodiments of the present invention. Electronic device processing systems 100A, 100B, 100C may be identical to electronic device processing system 100 previously described with reference to FIG. 1A-1B. An aisle adapted to allow service access in a side-by-side system may be eliminated. In particular, the respective carousels of the adjacent electronic device processing systems 100A-100C of the manufacturing system 800 may abutted directly to one another. This diamond platform configuration enables overall smaller fabrication space requirements and may also improve system serviceability. Furthermore, the shared use of one robot 903A, 903B (shown dotted), respectively, to service both carousels 908A, 910A, 908B, 910B) and load locks 912A, 912B, 914A, 914B allows continued operation even in the event of a failure or maintenance of one load lock 912A, 912B, 914A, 914B, albeit at a lower processing rate.

Figure 9B:
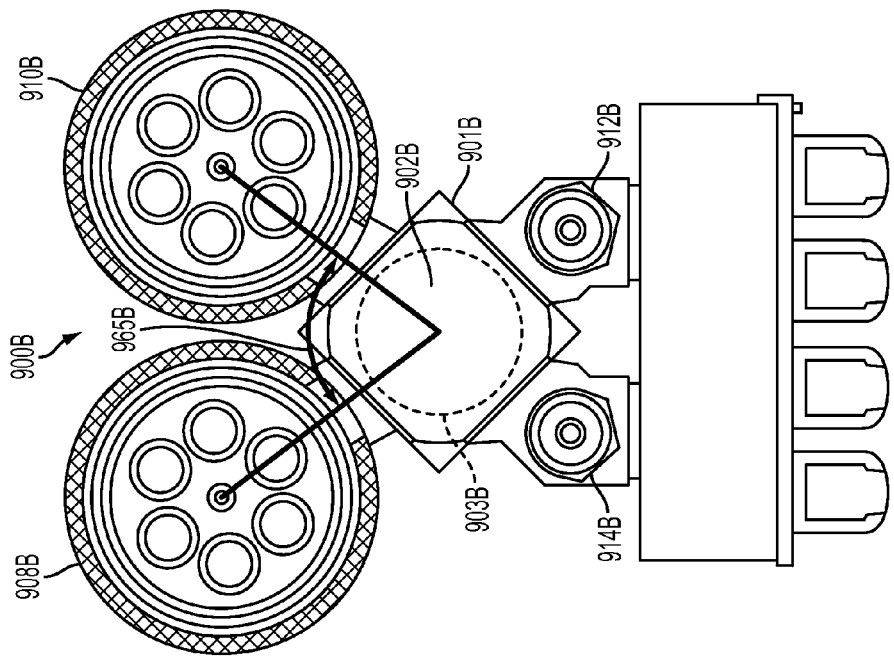
FIGS. 9A-9B illustrates top schematic views of electronic device processing systems in a straight diamond platform configuration (FIG. 9A), and in an alternative rotated diamond platform configuration (FIG. 9B) according to embodiments.

FIG. 9B illustrates that the carousels 908B, 910B of the electronic device processing system 900B may be positioned and configured on the mainframe housing 901B in a manner that draws the adjacent carousels 908B, 910B closer together laterally, and may draw the adjacent load locks 912B, 914B closer together laterally, as well. This further minimizes a width footprint of the electronic device processing system 900B, as compared to the electronic device processing system 900A. In particular, as shown in FIG. 9B, a first separation angle 965B circumscribed between the center of the transfer chamber 902B and through the rotational center of each carousel 908B, 908B may be less than 90 degrees. For example, the separation angle 965B may range between about 85 degrees and about 50 degrees, or even between about 70 degrees and about 50 degrees in some embodiments.

A load lock separation angle circumscribed between the center of the transfer chamber 902B and drawn through the placement center of each load lock 912B, 914B may be less than 90 degrees. For example, the load lock separation angle may range between about 85 degrees and about 50 degrees, or even between about 70 degrees and about 50 degrees in some embodiments.

Figure 9A:
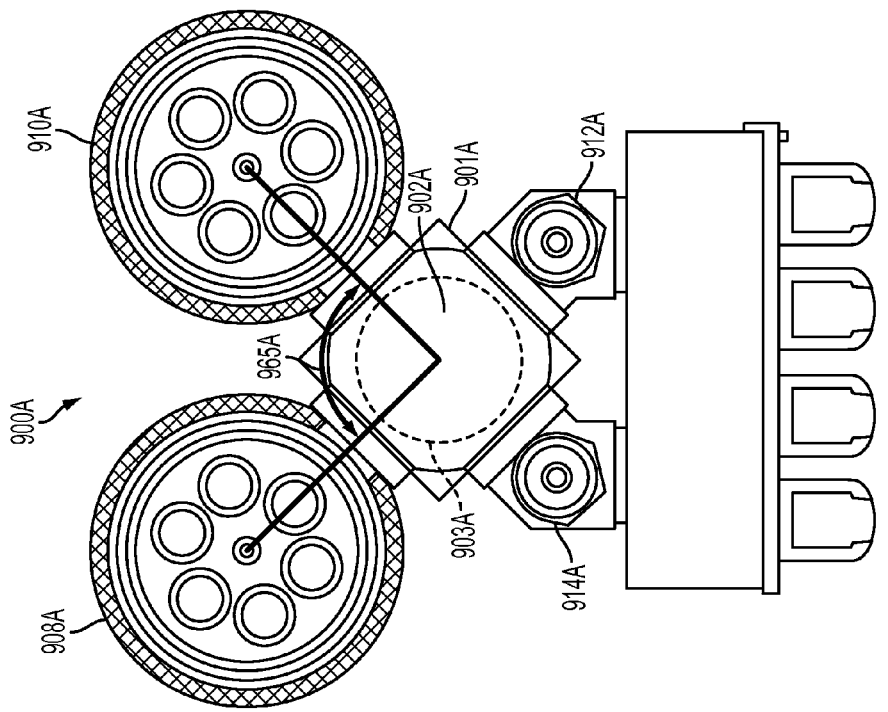

In this case, as well as the embodiment illustrated in FIG. 9A, the respective carousels 908A, 908B, 910A, 910B and load locks 912A, 912B, 914A, 914B may be configured (as shown) such that they are opposed from one another across the respective transfer chambers 902A, 902B formed in mainframe housings 901A, 901B. Moreover, the components may be arranged and lie along lines passing through the respective rotational center of each carousel 908A, 908B, 910A, 910B, the center of the transfer chamber 902A, 902B, and the placement center of each respective load lock 912A, 912B, 914A, 914B. The electronic device processing system 900A shown in the FIG. 9A embodiment may be referred to as a straight diamond platform in that the separation angle 965A is about 90 degrees, whereas the FIG. 9B embodiment may be referred to as a rotated diamond platform.

The foregoing description discloses only example embodiments of the invention. Modifications of the above-disclosed apparatus, systems and methods which fall within the scope of the invention will be readily apparent to those of ordinary skill in the art. Accordingly, while the present invention has been disclosed in connection with example embodiments, it should be understood that other embodiments may fall within the scope of the invention, as defined by the following claims.

The invention claimed is:

1. An electronic device processing system, comprising:
a mainframe housing including a transfer chamber, a first facet, a second facet opposite the first facet, a third facet, and a fourth facet opposite the third facet;
a first carousel assembly coupled to the first facet;
a second carousel assembly coupled to the third facet;
a first multi-position load lock coupled to the second facet, wherein the first multi-position load lock includes a first double height entrance, and further includes a first moveable lift body;
a first lift assembly coupled to the first moveable lift body;
a second load lock coupled to the fourth facet; and
a multi-axis robot comprising:
a first SCARA comprising:
a first upper arm adapted to rotate about a shoulder axis that extends through the first upper arm;
a first forearm rotationally coupled to and above the first upper arm at an outboard end of the first upper arm;
a first wrist member rotationally coupled to and below the first forearm at a first outer location of the first forearm; and
a first end effector coupled to the first wrist member, the first end effector disposed at a first height; and
a second SCARA comprising:
a second upper arm adapted to rotate about the shoulder axis, the shoulder axis also extending through the second upper arm;
a second forearm rotationally coupled to the second upper arm at an outboard end of the second upper arm, wherein the second forearm is positioned below the first forearm;
a second wrist member rotationally coupled to the second forearm at a second outer location of the second forearm; and
a second end effector coupled to the second wrist member, the second end effector disposed at a second height different from the first height;

wherein the first end effector of the first SCARA extends in a first direction away from the shoulder axis, wherein the second end effector of the second SCARA extends in a second direction away from the shoulder axis, and wherein the second direction is opposite the first direction and the first and second directions form substantially co-parallel lines of action;

wherein, at a first time, the first upper arm in a first extended position from the shoulder axis lies on a first plan view side of the substantially co-parallel lines of action and the second upper arm in a second extended position from the shoulder axis lies on a second plan view side of the substantially co-parallel lines of action, wherein the second plan view side is opposite the first plan view side;

wherein the first and second end effectors extend respectively in the first and second directions away from the shoulder axis along the substantially co-parallel lines of action at the first time such that the first and second end effectors respectively extend a distance from the shoulder axis sufficient to extend through a double height entrance of a process chamber and a double height entrance of a multi-position load lock respectively without extending the corresponding first or second wrist members therethrough;

wherein the multi-axis robot is adapted to operate in the transfer chamber to exchange substrates from both the first carousel assembly and the second carousel assembly; and wherein the first moveable lift body includes a plurality of supports, and the first lift assembly is configured to position at least a selected one of the plurality of supports to engage the first end effector at the first height, the first height being within the double height entrance, and is further configured to position the selected one of the plurality of supports to engage the second end effector at the second height, the second height being within the double height entrance.

2. The electronic device processing system of claim 1, wherein the multi-axis robot is configured and adapted to simultaneously place a first substrate into the first carousel assembly and a second substrate into the first multi-position load lock.

3. The electronic device processing system of claim 1, wherein the multi-axis robot is configured and adapted to simultaneously pick a first substrate from the first carousel assembly and a second substrate from the first multi-position load lock.

4. The electronic device processing system of claim 3, wherein the multi-axis robot is configured and adapted to retract, rotate, and then simultaneously place the first substrate into the first multi-position load lock and place the second substrate into the first carousel assembly.

5. The electronic device processing system of claim 1, wherein the first carousel assembly includes a carousel chamber and a rotating carousel platform having multiple substrate placement locations thereon.

6. The electronic device processing system of claim 1, wherein the second load lock is a second multi-position load lock.

7. The electronic device processing system of claim 1, wherein the plurality of supports are configured and adapted to respectively support multiple substrates.

8. The electronic device processing system of claim 7, comprising a greater or equal number of support locations than a number of stations in the first carousel assembly.

9. The electronic device processing system of claim 1, wherein the first double height entrance is sized to accommodate the first end effector and the second end effector, wherein the first end effector is at a different height than the second end effector.

10. An electronic device processing system, comprising:
a mainframe housing having a transfer chamber;
a process chamber coupled to a first facet of the mainframe housing;
a multi-position load lock coupled to a second facet of the mainframe housing at a position generally opposed from the first facet, wherein the multi-position load lock includes a double height entrance, and further includes a moveable lift body;
a lift assembly coupled to the moveable lift body; and
a multi-axis robot comprising:
a first SCARA comprising:
a first upper arm adapted to rotate about a shoulder axis that extends through the first upper arm;
a first forearm rotationally coupled to and above the first upper arm at an outboard end of the first upper arm;
a first wrist member rotationally coupled to and below the first forearm at a first outer location of the first forearm; and
a first end effector coupled to the first wrist member, the first end effector disposed at a first height; and
a second SCARA comprising:
a second upper arm adapted to rotate about the shoulder axis, the shoulder axis also extending through the second upper arm;
a second forearm rotationally coupled to the second upper arm at an outboard end of the second upper arm, wherein the second forearm is positioned below the first forearm;
a second wrist member rotationally coupled to the second forearm at a second outer location of the second forearm; and
a second end effector coupled to the second wrist member, the second end effector disposed at a second height different from the first height;
wherein the first end effector of the first SCARA extends in a first direction away from the shoulder axis, wherein the second end effector of the second SCARA extends in a second direction away from the shoulder axis, and wherein the second direction is opposite the first direction and the first and second directions form substantially co-parallel lines of action;
wherein, at a first time, the first upper arm in a first extended position from the shoulder axis lies on a first plan view side of the substantially co-parallel lines of action and the second upper arm in a second extended position from the shoulder axis lies on a second plan view side of the substantially co-parallel lines of action, wherein the second plan view side is opposite the first plan view side;
wherein the first and second end effectors extend respectively in the first and second directions away from the shoulder axis along the substantially co-parallel lines of action at the first time such that the first and second end effectors respectively extend a distance from the shoulder axis sufficient to extend through a double height entrance of a process chamber and a double height entrance of a multi-position load lock respectively without extending the corresponding first or second wrist members therethrough;

wherein the first and second end effectors are adapted to move within the transfer chamber to exchange substrates between the process chamber and the multi-position load lock, and wherein the first and second end effectors are operable to extend and retract along the substantially co-parallel lines of action; and wherein the moveable lift body includes a plurality of supports, and the lift assembly is configured to position at least a selected one of the plurality of supports to engage the first end effector at the first height, the first height being within the double height entrance, and is further configured to position the selected one of the plurality of supports to engage the second end effector at the second height, the second height being within the double height entrance.

* * * * *